(12) United States Patent
Fant et al.

(10) Patent No.: US 9,404,795 B2
(45) Date of Patent: Aug. 2, 2016

(54) OPITICAL DETECTOR WITH ADJUSTABLE SPECTRAL RESPONSE

(71) Applicant: Infineon Technologies AG, Neubiberg (DE)

(72) Inventors: Andrea Fant, Nimis (IT); Herbert Schaunig, Villach (AT)

(73) Assignee: Infineon Technologies AG, Neubiberg (DE)

( * ) Notice: Subject to any disclaimer, the term of this patent is extended or adjusted under 35 U.S.C. 154(b) by 399 days.

(21) Appl. No.: 14/045,396

(22) Filed: Oct. 3, 2013

(65) Prior Publication Data

US 2015/0097105 A1    Apr. 9, 2015

(51) Int. Cl.
| | |
|---|---|
| *G01J 3/50* | (2006.01) |
| *H01L 31/00* | (2006.01) |
| *G01J 1/42* | (2006.01) |
| *G01J 1/04* | (2006.01) |
| *H01L 27/146* | (2006.01) |
| *G01J 1/44* | (2006.01) |

(52) U.S. Cl.
CPC .............. *G01J 1/4228* (2013.01); *G01J 1/0437* (2013.01); *H01L 27/14623* (2013.01); *H01L 27/14647* (2013.01); *G01J 2001/446* (2013.01)

(58) Field of Classification Search
CPC ................... H01L 27/14623; H01L 27/14647; H01L 27/14652; G01J 1/0437; G01J 2001/446; G01J 1/4228; G01J 3/36; G01J 3/28; G01J 3/2803
USPC ............... 250/226, 208.1, 214 R, 214.1, 206; 257/440, 435; 348/272, 273, 279, 278, 348/280
See application file for complete search history.

(56) References Cited

U.S. PATENT DOCUMENTS 5,502,299 A  *  3/1996  Standley ................... G10J 1/44
                                                             250/208.2
5,663,657 A     9/1997  Lagowski et al.
(Continued)

FOREIGN PATENT DOCUMENTS

| CN | 101611626 A | 12/2009 |
|---|---|---|
| CN | 102095495 A | 6/2011 |

(Continued)

OTHER PUBLICATIONS

Gilblom, David et al., "Real-time color imaging with a CMOS sensor having stacked photodiodes," SPIE Paper No. 5210-14, SPIE Annual Meeting 2003, Aug. 3-8, 2003, retrieved from www.alt-vision.com/publications.htm, 11 pp.

*Primary Examiner* — Pascal M Bui Pho
*Assistant Examiner* — Jennifer Bennett
(74) *Attorney, Agent, or Firm* — Shumaker & Sieffert, P.A.

(57) ABSTRACT

An optical detector includes a first set of one or more photodiodes configured to generate a first photocurrent according to a first spectral response function of an incident light, a second set of one or more photodiodes configured to generate a second photocurrent according to a second spectral response function of the incident light, and a third set of one or more photodiodes configured to generate a third photocurrent according to a third spectral response function of the incident light. The optical detector further includes a module configured to output an indication of the intensity of the incident light according to a fourth spectral response function based on each of the first photocurrent, the second photocurrent, and the third photocurrent.

21 Claims, 5 Drawing Sheets

(56) References Cited

U.S. PATENT DOCUMENTS

| | | | |
|---|---|---|---|
| 6,211,521 B1 * | 4/2001 | Bawolek | G02B 5/201 250/208.1 |
| 6,359,323 B1 | 3/2002 | Eom et al. | |
| 6,455,908 B1 | 9/2002 | Johnson et al. | |
| 6,596,981 B1 | 7/2003 | Aswell et al. | |
| 6,960,753 B2 | 11/2005 | Cheung | |
| 7,620,291 B1 | 11/2009 | Aswell | |
| 7,755,117 B2 | 7/2010 | Kalnitsky et al. | |
| 7,773,134 B2 | 8/2010 | Tan et al. | |
| 7,889,249 B2 | 2/2011 | Tan et al. | |
| 7,960,766 B2 | 6/2011 | Kalnitsky et al. | |
| 7,960,807 B2 | 6/2011 | Lin et al. | |
| 8,274,051 B1 | 9/2012 | Aswell et al. | |
| 8,309,994 B2 | 11/2012 | Kalnitsky et al. | |
| 8,456,410 B2 | 6/2013 | Kalnitsky et al. | |
| 2004/0133863 A1 * | 7/2004 | Dai | H01L 27/14603 716/111 |
| 2008/0136336 A1 | 6/2008 | Kalnitsky et al. | |
| 2008/0191298 A1 * | 8/2008 | Lin | G01J 1/4204 257/432 |
| 2011/0068255 A1 * | 3/2011 | Zheng | G01J 1/4204 250/208.2 |

FOREIGN PATENT DOCUMENTS

| | | |
|---|---|---|
| EP | 2323170 A1 | 5/2011 |
| WO | 2012007580 A2 | 1/2012 |

* cited by examiner

OPTICAL DETECTOR WITH ADJUSTABLE SPECTRAL RESPONSE

TECHNICAL FIELD

This disclosure is generally related to photodiodes.

BACKGROUND

A photodiode may provide a spectral response for photon to current conversion that does not match a desired response for the application of the photodiode. For example, a complementary metal-oxide-semiconductor (CMOS) photodiode produces a spectral response that does not match the response of a human eye (called photopic response). In this example, the greatest mismatch of the spectral response of a CMOS photodiode and a photopic response occurs at the near infrared (NIR) spectrum, where the CMOS photodiode has a relatively high sensitivity compared to a human eye.

Different techniques have been used to tune photodiodes to produce the desired spectral responses. As one example, a tuned optical filter may be positioned between the light source and the photodiode. As another example, Fabry-Pérot interferometers or etalons may be used to tune photodiodes to produce the desired spectral responses. As a further example, a sensor may include multiple photodiodes in a stacked configuration, each photodiode in the stack providing a different spectral response. The currents from each photodiode in the stack may be compared to determine the intensities of the light source across the spectrum in order to facilitate compensation of the electrical responses of the stacked photodiodes in order to produce a desired spectral response.

SUMMARY

In general, this disclosure is directed to optical detection techniques, and more particularly, but without limitation to, optical detection techniques facilitating a desired spectral response.

In one example, an optical detector includes a first set of one or more photodiodes configured to generate a first photocurrent according to a first spectral response function of an incident light, a second set of one or more photodiodes configured to generate a second photocurrent according to a second spectral response function of the incident light, and a third set of one or more photodiodes configured to generate a third photocurrent according to a third spectral response function of the incident light. The optical detector further includes a module configured to output an indication of the intensity of the incident light according to a fourth spectral response function based on each of the first photocurrent, the second photocurrent, and the third photocurrent. The fourth spectral response function is different from the first spectral response function, from the second spectral response function, and from the third spectral response function.

In another example, a method includes receiving an indication of a first photocurrent from one or more photodiodes configured to generate the first photocurrent in response to an incident light according to a first spectral response function, receiving an indication of a second photocurrent from one or more photodiodes configured to generate the second photocurrent in response to the incident light according to a second spectral response function, and receiving an indication of a third photocurrent from one or more photodiodes configured to generate the third photocurrent in response to the incident light according to a third spectral response function. The method further includes outputting an indication of the intensity of the incident light according to fourth spectral response function. The indication of the intensity of the incident light is based on each of the first photocurrent, the second photocurrent, and the third photocurrent. The fourth spectral response function is different from the first spectral response function, from the second spectral response function, and from the third spectral response function.

In another example, a system comprising a first set of one or more photodiodes configured to generate a first photocurrent according to a first spectral response function of an incident light, a second set of one or more photodiodes configured to generate a second photocurrent according to a second spectral response function of the incident light, and a third set of one or more photodiodes configured to generate a third photocurrent according to a third spectral response function of the incident light. The system further includes means for outputting an indication of the intensity of the incident light according to a fourth spectral response function based on each of the first photocurrent, the second photocurrent, and the third photocurrent. The fourth spectral response function is different from the first spectral response function, from the second spectral response function, and from the third spectral response function.

The details of one or more examples and techniques of this disclosure are set forth in the accompanying drawings and the description below. Other features, objects, and advantages of the disclosure may be apparent from the description and drawings, and from the claims.

DETAILED DESCRIPTION

This disclosure includes a variety of examples of photodiode configurations that facilitate an optical detector that provides a desired spectral response, such as a photopic response. In some examples, an optical detector may include multiple photodiode configurations, each with its own spectral response function. As further disclosed herein, the different spectral response functions of the photodiode configurations facilitate calculation of a desired spectral response of the optical detector that is different than the spectral response of any of the photodiode configurations of the optical detector.

In some examples, one or more photodiode configurations may include shielding from direct incident light. In other examples, all of the photodiode configurations may be unshielded, but otherwise configured to produce the different spectral responses to incident light.

In some examples, the photodiodes in an optical detector may each maintain their configuration, such that each photodiode within the optical detector is only associated with a single photodiode configuration. In other examples, photodiodes in an optical detector may have selectable configurations, e.g., by varying shorting between any components of the photodiode or varying the location of positive and negative terminals used to collect current from the photodiode. In such configurations, the optical detector may include one or more photodiodes that may be individually configured to produce the different spectral responses to incident light.

Such an optical detector may include two parts, where one is a standard photodiode element, with an n-type well in a p-type substrate, and the other has the same configuration but is also shielded from some wavelengths of light with a visible light shielding layer, such as a metal. If the sensitive area is built so that the two photodiodes are interleaved with a small enough pitch, the NIR content may spread to both diode structures, while the visible light content may only reach the unshielded photodiode. The difference of the two spectral responses may then be centered around the visible light region. An example of one such optical detector is shown in FIG. 1.

Figure 1:
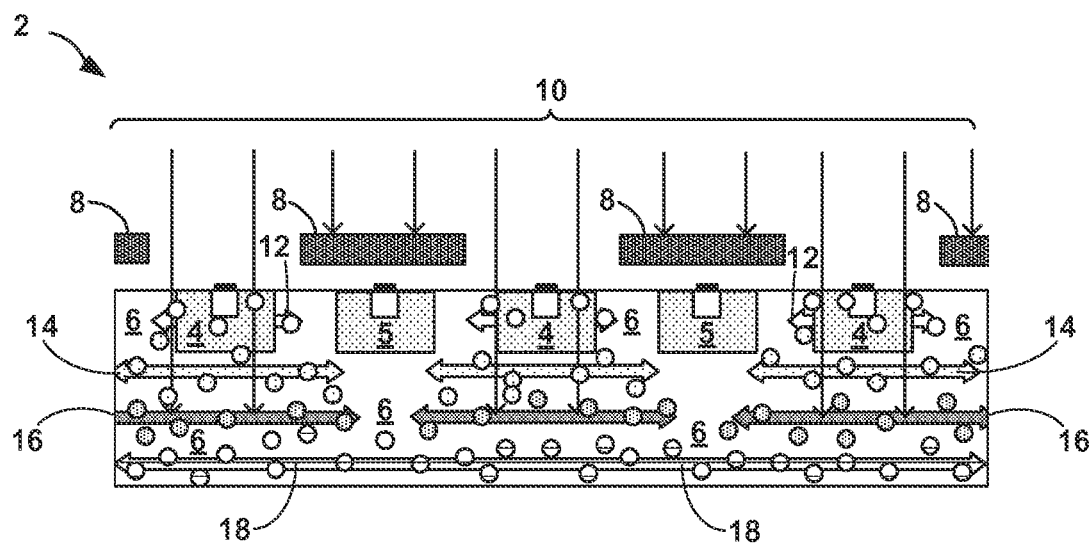
FIG. 1 is a conceptual diagram of an optical detector including shielded and unshielded photodiodes.

FIG. 1 is a conceptual diagram of optical detector 2. Optical detector 2 includes unshielded photodiodes 4, interspaced with shielded photodiodes 5. Unshielded photodiodes 4 and shielded photodiodes 5 are located in common substrate 6. Unshielded photodiodes 4 and shielded photodiodes 5 are commonly configured except that shielded photodiodes 5 are shielded from incident light 10 by shielding element 8. In some examples, substrate 6 may be a p-type substrate, and unshielded photodiodes 4 and shielded photodiodes 5 may each include an n-type well with a floating p-type diffusion.

Unshielded photodiodes 4 provide a different spectral response function compared to shielded photodiodes 5 because incident light 10 is being blocked from shielded photodiodes 5 by shielding element 8. The dimensions of shielding element 8 may be selected to correspond to the spacing of unshielded photodiodes 4 and shielded photodiodes 5 within common substrate 6. The spacing of photosite structure unshielded photodiodes 4 and shielded photodiodes 5 may be selected to be small enough, such as 5 μm to 10 μm, to allow collection of diffused charges 16, 18 by the shielded photodiodes 5 and provide a spectral response that is quite different between unshielded photodiodes 4 and shielded photodiodes 5.

Within optical detector 2, blue wavelengths 12 of incident light 10 generate electron/hole pairs near the surface of unshielded photodiodes 4, such that substantially all generated charge from blue wavelengths 12 of incident light 10 is be collected within unshielded photodiodes 4. In contrast, red wavelengths 16 and NIR wavelengths 18 reach deeper into substrate 6 before the photons are collected. This means that the generated electron/hole pairs from red wavelengths 16 and NIR wavelengths 18 have room for diffusion (there may be no drift in outside the depletion region of the n-type well p-type substrate junction). Thus, generated charge from red wavelengths 16 and NIR wavelengths 18 will reach both unshielded photodiodes 4 and shielded photodiodes 5 with approximately the same probability, such that photocurrents from red wavelengths 16 and NIR wavelengths 18 are about equally distributed between unshielded photodiodes 4 and shielded photodiodes 5.

In this manner, in the example of optical detector 2, unshielded photodiodes 4 receive charge from the entire spectrum of incident light 10, including blue wavelengths 12, green wavelengths 14, red wavelengths 16, and near infra-red (NIR) wavelengths 18. In contrast, shielded photodiodes 5 receive charge from only a portion of the spectrum of incident light 10, the portion including all NIR wavelengths 18, part of red wavelengths 16, little of green wavelengths 14, and none of blue wavelengths 12.

The contrasting spectral response functions between unshielded photodiodes 4 and shielded photodiodes 5 of optical detector 2, facilitates the removal of NIR spectral component of incident light through an estimation of the NIR spectral content of the incident light. For different types of light sources the amount of NIR light is very different, a further control of the spectral response, e.g., to better approximate a photopic response, can be obtained by estimating the NIR content compared to the visible content and applying a correction factor to the calculated difference that depends on this parameter. This may reduce the error in the estimate of the ambient light and provide a more accurate result. In some examples, an optical detector may include a third photodiode configuration to facilitate more accurate correction factors.

Figure 2:
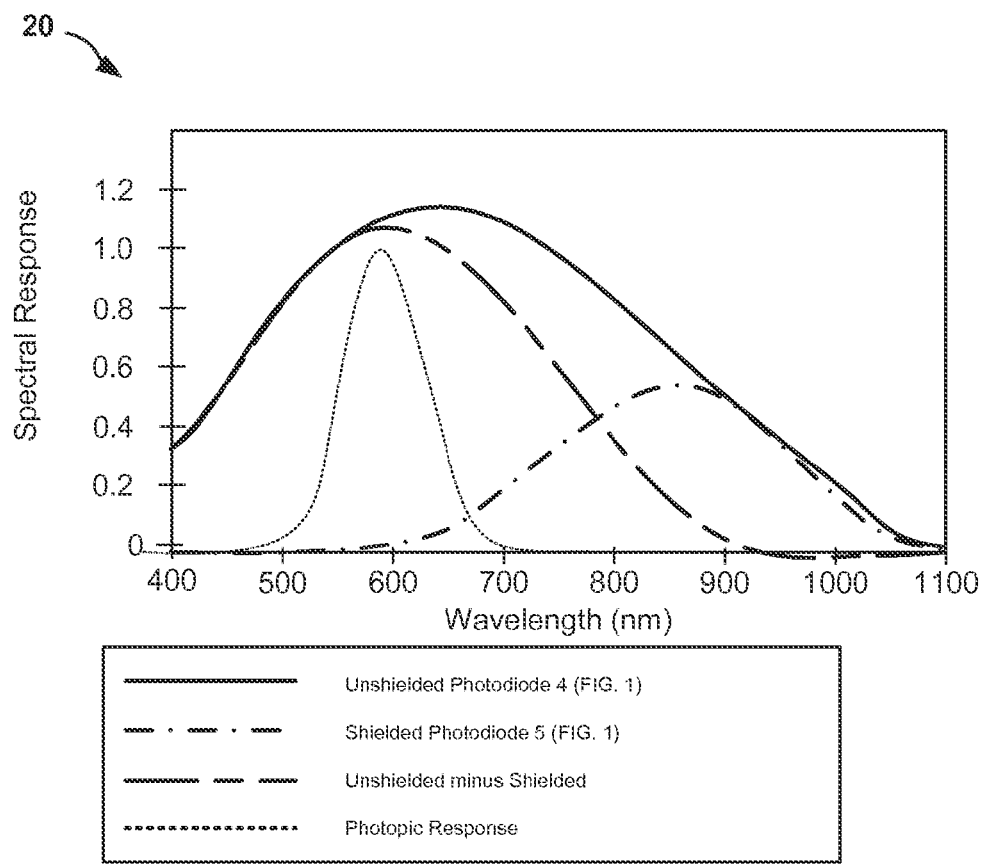
FIG. 2 is a graph illustrating example spectral responses of shielded and unshielded photodiodes versus a photopic response.

FIG. 2 is a graph 20 illustrating example spectral responses of shielded and unshielded photodiodes versus a photopic response. In one example, the unshielded photodiode response may be considered that of unshielded photodiodes 4, whereas the shielded photodiode response may be considered that of shielded photodiodes 5.

As shown in graph 20, the broadest spectral response belongs to unshielded photodiodes 4, which peaks in the NIR. Shielded photodiodes 5 provide a spectral response function that is proportionally more sensitive in the NIR spectrum as compared to the spectral response function of unshielded photodiodes 4 because the shielded photodiodes 5 are not sensitive to shorter wavelengths, such as blue wavelengths 12 (FIG. 1). Also shown is the shielded photodiode response subtracted from the unshielded photodiode response, difference of the two responses. This produces a peak that is approximately coincident with the peak of the photopic response, between 550 and 600 nm.

Figure 4:
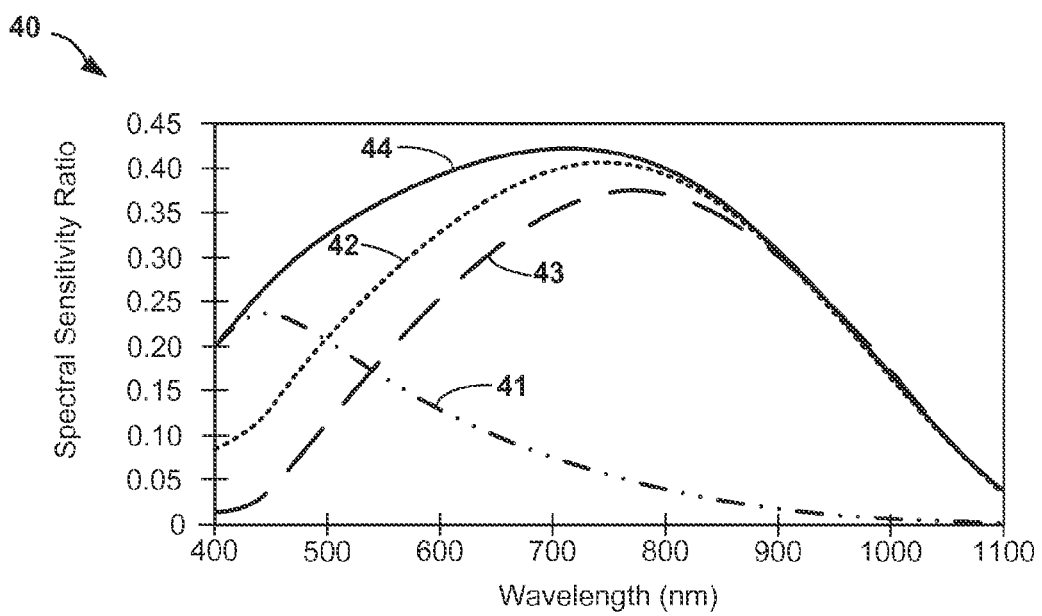
FIG. 4 is a graph illustrating example spectral responses of the photodiode configurations shown in FIG. 3A-3D.
Figure 4:
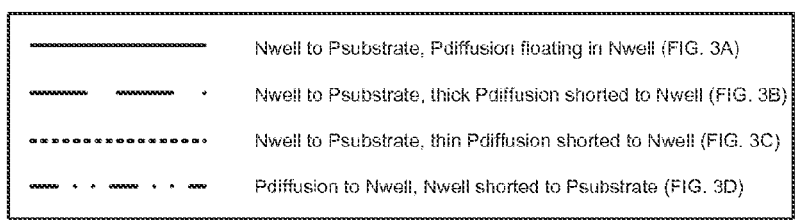

In addition, a coefficient may be applied to the difference to improve the NIR rejection in the combined response, that is, the shielded photodiode response subtracted from the unshielded photodiode response. In one example, a third photodiode configuration may also be used within an optical detection system to provide an additional spectral response function indicating the proportion of wavelengths of less than 600 nm within the incident light. For example, as indicated in FIG. 4, photodiode configuration 30D may provide such a spectral response function.

FIG. 3A-3D illustrate photodiodes 30A-30D (collectively "photodiodes 30"). In addition, FIG. 4 is a graph 40 illustrating example spectral responses of the photodiode configurations shown in FIG. 3A-3D. As shown in FIG. 4, each of photodiodes 30 provides a different spectral response to incident light.

Each of photodiodes 30 are of similar construction in that they include a p-type substrate 34 with a n-type well 32 and a p-type diffusion 36. Each of photodiodes 30 may be manufactured using complementary metal-oxide-semiconductor (CMOS) processes. In some examples, a common substrate may be used with a multitude of photodiodes 30 in one or more configurations.

In photodiode 30A, p-type diffusion 36A is floating in n-type well 32. Photodiode 30A produces current between n-type well 32 and p-type substrate 34. Photodiode 30A provides a relatively broad spectral response function in that it captures the greatest proportion of incident light of all of photodiodes 30 as indicated by curve 44 in FIG. 4. A similar spectral response function to that indicated by curve 44 would also be expected for an alternative photodiode configuration that did not include a p-type diffusion. However, the difference between the spectral response function of photodiode 30A and a similar photodiode 30A without a p-type diffusion could be that the spectral response function of photodiode 30A would provide increased current amplitude for a given incident light, but provide lower dark current than the similar photodiode 30A without a p-type diffusion.

In photodiode 30B, p-type diffusion 36B is shorted to n-type well 32. Photodiode 30B produces current between n-type well 32 and p-type substrate 34. Photodiode 30B is less sensitive to blue light as compared to photodiode 30A, thus curve 43, representing the spectral response function of photodiode 30B is the same or similar to curve 44 of photodiode 30A in the NIR region, but curve 43 goes to zero in the blue region.

In photodiode 30C, p-type diffusion 36C is shorted to n-type well 32. Photodiode 30C produces current between n-type well 32 and p-type substrate 34. In this example, p-type diffusion 36C is thinner than diffusion 36B. As represented by curve 42, the thinner dimension of p-type diffusion 36C compared to diffusion 36B causes photodiode 30C to be more sensitive to blue light than photodiode 30B. However, photodiode 30C is still less sensitive to blue light than photodiode 30A.

In photodiode 30D, n-type well 32 is shorted to in p-type substrate 34. Photodiode 30D produces current between n-type well 32 and p-type diffusion 36. This response is relatively much more sensitive to the blue and UV portions of the spectrum, peaking below 500 nm, as represented by curve 41. Note that in some examples, the difference between curve 44 of photodiode 30A and curve 43 of photodiode 30B may be similar to curve 41 of photodiode 30D. Thus, depending on the specific configurations of photodiodes 30A, 30B and 30D, including photodiode 30D within an optical detector that already includes photodiode 30A and photodiode 30B may provide limited additional information useful in determining a spectral response function of an incident light.

Photodiodes 30 each provide a different spectral response relative to each other based on their different configurations. As disclosed herein, an optical detector that uses one or more of photodiodes may output an indication of the intensity of the incident light according to a desired spectral response based on photocurrents from its photodiodes. The spectral response of the optical detector may be different from the spectral responses of any one of the photodiodes within the optical detector.

An optical detector may be tuned to approximate a photopic response by estimating the NIR spectral content of an incident light. Then the spectral response of a broad spectrum photodiode, such as photodiode 30A (similar to photodiode 4), may be compensated to a larger degree by subtracting the stronger NIR portion of the incident light.

In one example, the spectral response of photodiode 30B may be used to determine a compensation factor for the spectral response photodiode 30A. In particular, photodiode 30B provides a different spectral response in the blue region of the spectrum. Thus, the ratio of the photocurrent from photodiode 30A versus the photocurrent from photodiode 30B, when both receive the same incident light, may be used to estimate the spectral content of the incident light. The estimated spectral content of the incident light may be used to select a compensation factor for the photocurrent of photodiode 30A in order to approximate a photopic response.

Figure 5A:
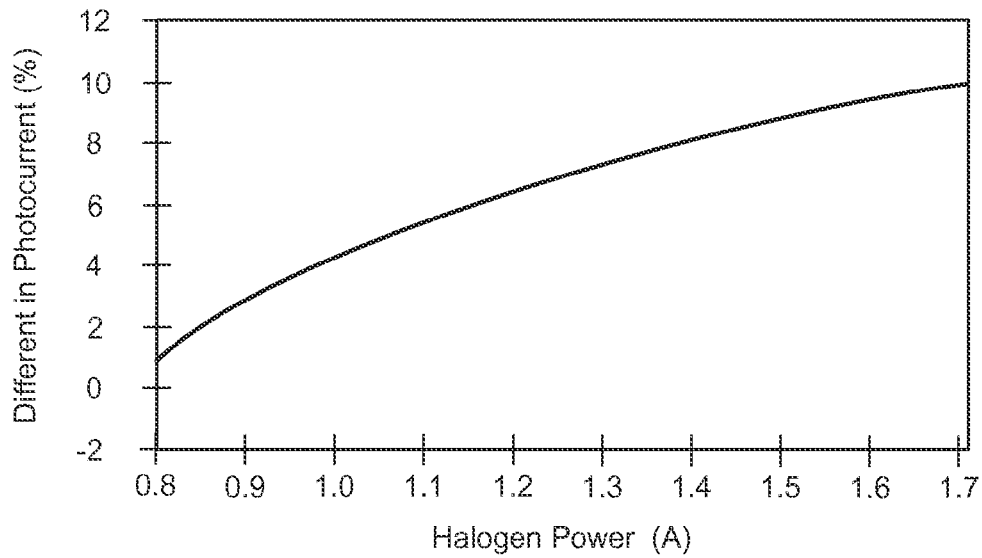
FIG. 5A-5B illustrate the relative photocurrents of two photodiode configurations under halogen and LED incident lights.
Figure 5B:
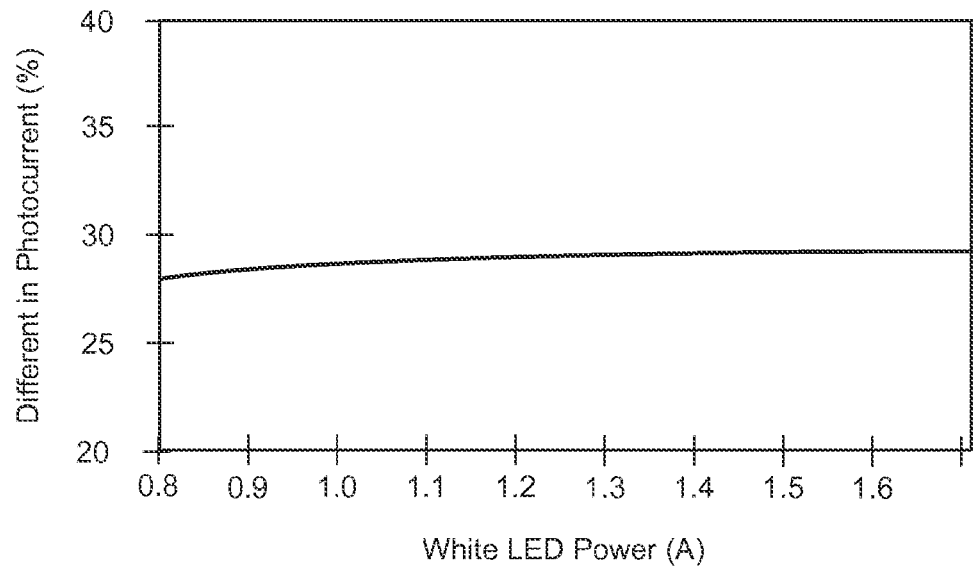

FIG. 5A-5B illustrate the relative difference of photocurrents of two photodiode configurations under halogen and LED incident lights from an example experiment. In particular, FIG. 5A illustrates the percent photocurrent difference of photodiode 30A and photodiode 30B for a halogen incident light source, whereas FIG. 5B illustrates the relative percent photocurrent difference of photodiode 30A and photodiode 30B for a white light emitting diode (LED) incident light source. The percent photocurrent difference between photodiode 30A and photodiode 30B can be represented mathematically as $((I_{30A}-I_{30B})/I_{30A})*100$=percent difference, where $I_{30A}$ is the photocurrent from photodiode 30A, and $I_{30B}$ is the photocurrent from photodiode 30B.

As shown in FIG. 5A, the percent photocurrent difference between photodiode 30A and photodiode 30B is fairly minimal for a halogen lamp, where the NIR content is dominant. However, the proportion of the NIR content varies with the amperage of the halogen lamp. The change in percent photocurrent difference between photodiode 30A and photodiode 30B at different halogen lamp amperages illustrates the dependency of the percent photocurrent difference between photodiode 30A and photodiode 30B from the color temperature of the incident light.

In contrast, as shown in FIG. 5B, the percent photocurrent difference between photodiode 30A and photodiode 30B is much larger for a white LED, and was detected to be as much as about thirty percent during the experiment. A white LED is a cold light source, such that the different spectral responses of photodiode 30A versus photodiode 30B results in the significant differences between the photocurrents from photodiode 30A versus photodiode 30B due to the large proportion of blue light in the white LED light source.

As the examples of photodiodes 30 illustrate, standard CMOS technology may be used to provide multiple photodiode configurations to facilitate an optical detector that provides a spectral response function tuned as desired. Each of the examples of photodiodes 30 may also be used in both shielded and unshielded configurations to provide additional spectral responses that might provide useful to tune a spectral response function of an optical detector. In general, using three or more photodiode configurations as inputs to an optical detector may allow a more precise spectral response of the optical detector.

In some examples, an optical detector system may use analogue circuitry to combine photodiode output photocurrents to produce the turned spectral response that is different from the spectral responses of any of the photodiode configurations of the optical detector. In other examples, an optical detector may digitally process the different photocurrents detected from the photodiode configurations to provide the spectral response function of the optical detector. Such digital analysis may include formula and/or a look-up table or other processes to generate an indication of the intensity of the incident light according the desired spectral response function of the system. The output of an optical detector that receives indications of photocurrents from three different photodiode configurations is represented by Equation 1 below.

$$\text{Detector Spectral Response}=f(P1,P2,P3) \quad \text{(Equation 1)}$$

In Equation 1, f represents a function and P1, P2, P3 represent indications of the amplitude of the photocurrents of the photodiode configurations used in the optical detector system. Thus, the output of the indication of the intensity of an incident light is based on a combination of each of the photocurrents from the three different photodiode configurations.

The function, f, of equation 1 may vary considerably depending on the spectral response functions of the included photodiode configurations and the desired spectral response function of the optical detector. In some examples, the optical detector system may use a look-up table to limit mathematical calculations required to produce an indication of the intensity of the incident light according to the desired spectral response function. In any event, the optical detector system may use both relative values of the different photocurrents and the absolute value of at least one photocurrent to produce the indication of the intensity of the incident light according to the desired spectral response function. In addition, rather than simply providing a single light intensity value, the optical detector system may also provide an indication of the spectral content of the light source.

In some examples, the optical detector system may use more than three different photodiode configurations to produce the indication of the intensity of an incident light. In other examples, as discussed above, the optical detector system may use only two different photodiode configurations to produce the indication of the intensity of an incident light.

Figure 3A:
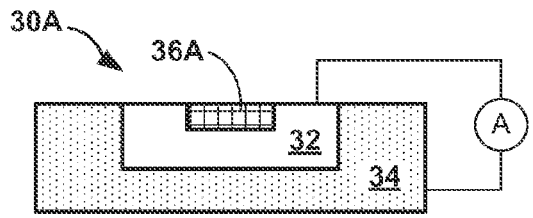
FIG. 3A-3D illustrate photodiodes in different electrical configurations.
Figure 3B:
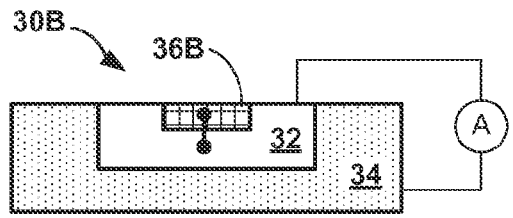
Figure 3C:
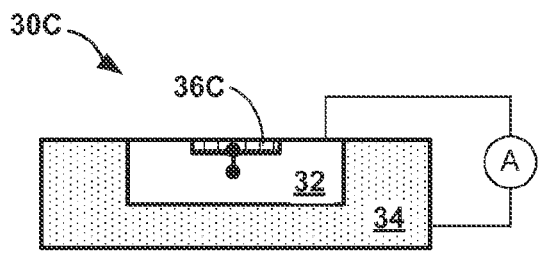
Figure 3D:
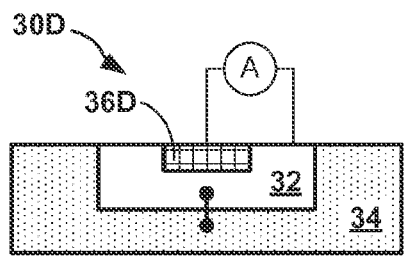

In one example optical detector, the three photodiode configurations may be photodiodes 30A, 30B and 30C (FIGS. 3A-3C). In another example, the three photodiode configurations may be first, photodiode 30A (similar to photodiode 4 of FIG. 1), second, photodiode 30A shielded (similar to of FIG. 1), and third, photodiode 30B. Any number of other combinations of photodiodes 30A, 30B, 30C and 30D in both shielded and unshielded configurations, as well as any other photodiode configurations may be used to provide different spectral response functions in an optical detector or optical detector system.

Figure 6:
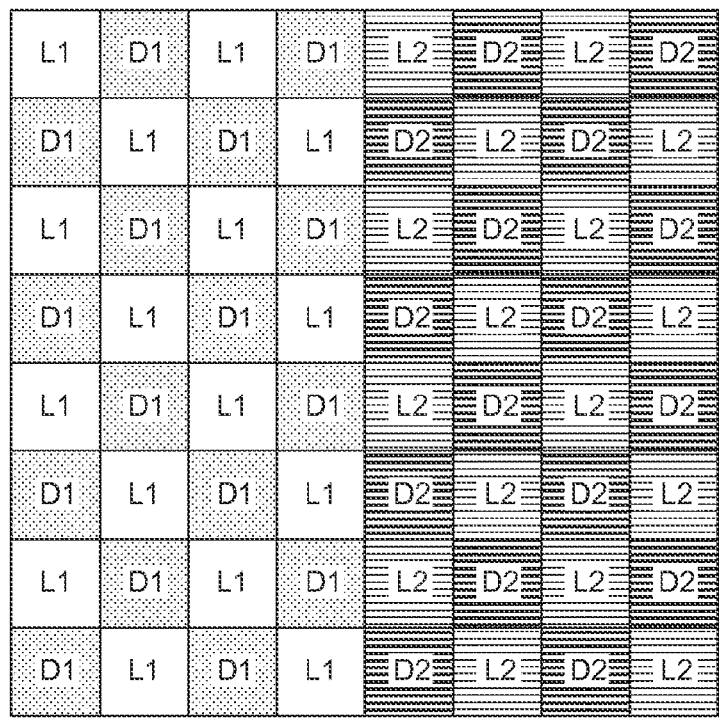
FIGS. 6-7 illustrate example arrays of two photodiode configurations, including shielded and unshielded photodiodes in each configuration.
Figure 7:
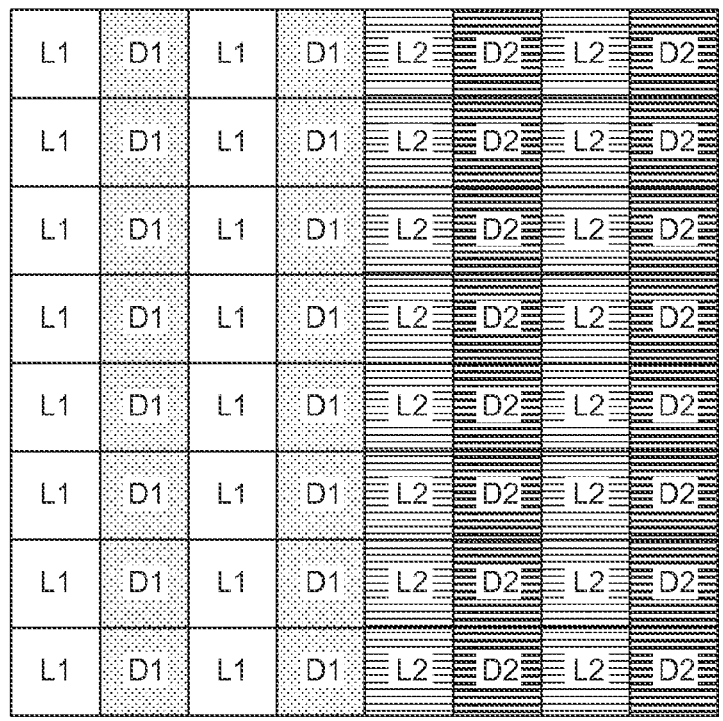

FIGS. 6-7 illustrate example arrays of two photodiode configurations, including shielded and unshielded photodiodes in each configuration. As represented in both FIG. 6 and FIG. 7, L1 represents a first unshielded photodiode configuration, whereas D1 represents a shielded photodiode configuration otherwise the same or similar to the photodiode configuration L1. Similarly, L2 represents a second unshielded photodiode configuration, whereas D2 represents a shielded photodiode configuration otherwise the same or similar to the photodiode configuration L2.

As shown in array 60, shielding elements are interspersed in a checkerboard pattern. In contrast, in array 70 shielding elements are arranging in strips over alternating rows of photodiodes. Generally, each of the photodiodes within an array shares a common substrate. Many additional variants of the arrangement of photodiode array unit cells, for example, to minimize leakage current or increase the fill-factor of the array.

Both array 60 and array 70 would produce four different photocurrent outputs, one of each of L1, D1, L2, and D2. In an example, photodiode configurations L1 may be the same or similar as photodiode 30A (FIG. 3A), whereas photodiode configurations L2 may be the same or similar as photodiode 30B (FIG. 3B). In such an example, the response function of D1 and D2 would be similar because both would receive only the NIR portion of the spectrum by diffusion.

In such an example, if a photopic response is desired, a compensation factor may be calculated as follows. First, consider that the difference R1=L1−D1 is the dark-current and IR compensated output and B=L1−L2 provides a blue-type spectral response (similar to curve 41 of FIG. 4). Then, factors C1=B/L1 or C2=B/L2, which contain the same type of information about the spectral content of the incoming light, may be used to compensate the spectral response for the NIR content when it is dominant. The compensation formula may be in the form of Equation 2, with K determined as to minimize the error for different values of C1 or C2.

$$\text{Detector Spectral Response} = K*R1 \quad \text{(Equation 2)}$$

As one example, for a photopic response, a factor K=⅛ may be appropriate when the light is recognized by means of C1 or C2 to be halogen or natural sunlight, whereas a factor of K=1 may be appropriate when the light is cold (LED light sources). As mentioned above, different formulas can be used to achieve this compensation; the described principle is independent from the chosen formula.

In other examples, the availability of the D1 and D2 current outputs may facilitate an IR sensitive detector, with reduced response in the visible region. This current can be used for a reflection based IR proximity measurement without additions to a photodiode structure.

The independent responses of the three different types of photodiodes are combined in a formula to extract the spectral content of the incoming light or to further increase the precision of the incident light amplitude measurement as indicated by the output of the optical detector. As an implementation example, an estimation of the incident light amplitude measurement is indicated by the output of the optical detector according to Equation 3, thus using the additional data provided by L2 to improve on the precision that would be obtained from a detector that only L1 and D1.

$$\text{Detector Spectral Response} = L1 - k1*B - k2*D1 \quad \text{(Equation 3)}$$

Figure 8:
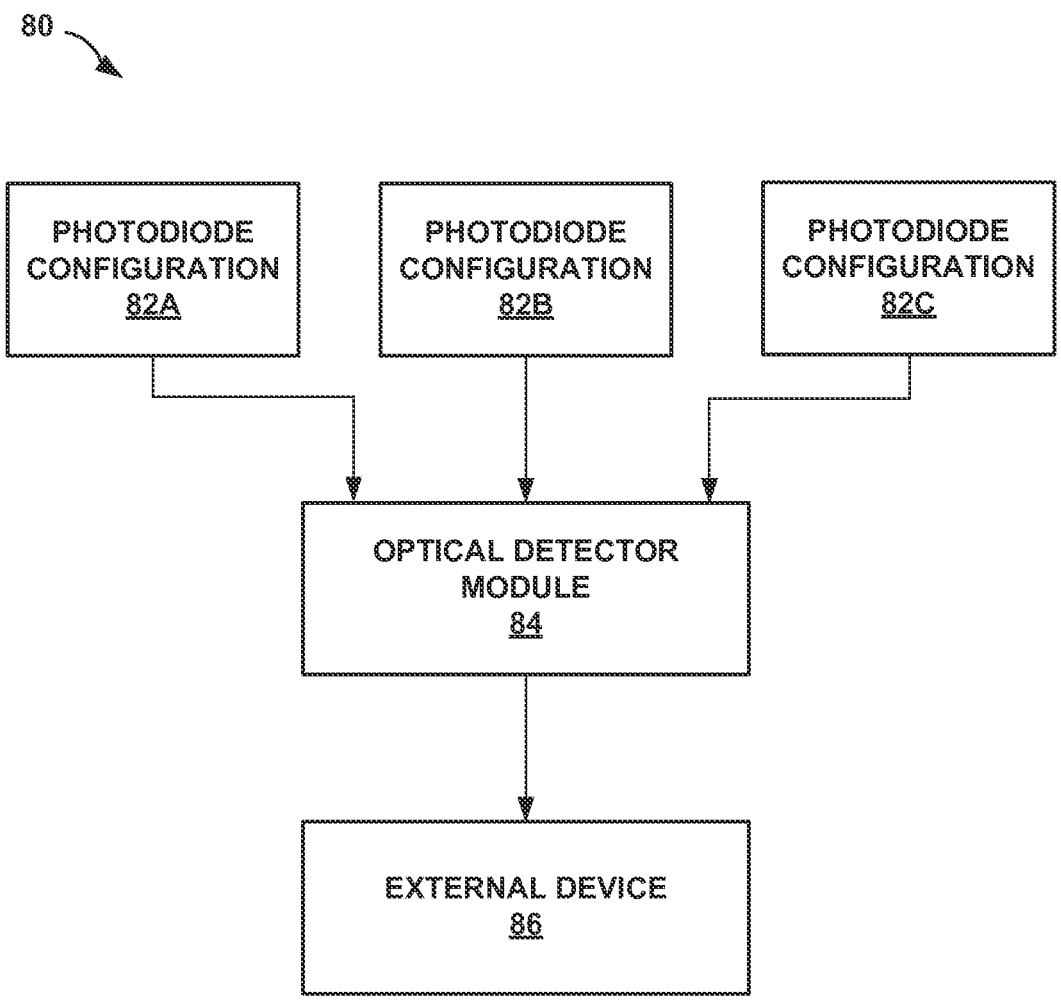
FIG. 8 is a conceptual block diagram of an optical detection system configured to output a compensated spectral response.

FIG. 8 is a conceptual block diagram of optical detection system 80 configured to output a compensated spectral response. Optical detection system 80 includes three sets of one or more photodiodes: photodiodes 82A, photodiodes 82B and photodiodes 82C (collectively "photodiodes 82"). Indications of photocurrents produced by photodiode 82 are directed to optical detection module 84. In turn, optical detection module 84 outputs an indication of the intensity of the incident light to external device 86, which may utilize the output of optical detection module 84 in any number of ways, such as, for example, to set the brightness level of an automatically adjustable light source, such as a screen or other display or an indoor or outdoor ambient light source.

The first set of one or more photodiodes 82A is configured to generate a first photocurrent according to a first spectral response function of an incident light. The second set of one or more photodiodes 82B is configured to generate a second photocurrent according to a second spectral response function of the incident light. The third set of one or more photodiodes is configured to generate a third photocurrent according to a third spectral response function of the incident light. The first, second and third spectral response function are different from each other such that each provides a unique data to optical detection module 84 to facilitate determination of the intensity of the incident light according a desired spectral response function.

Optical detection module 84 receives the indications of the photocurrents from photodiodes 82 and outputs an indication of the intensity of the incident light according to a fourth spectral response function based on each of the photocurrents. The fourth spectral response function is different from the first, second and third spectral response functions. In one particular example, the fourth spectral response function may approximate a photopic response.

In one example, the photodiodes 82A may be mutually exclusive with photodiodes 82B and photodiodes 82C, and photodiodes 82B may be mutually exclusive with photodiodes 82C. In other examples, optical detection system 80 may provide for selectable configurations of photodiodes in the system. For example, a single photodiode element may be connected to a control module that changes the photodiode configuration between two or more of photodiodes 30 (FIGS. 3A-3D). For example, to transition between photodiode configuration 30A and photodiode configuration 30B, a controller may close an electrical switch that shorts n-type well 32 to p-type diffusion 36. However, because of the different thickness of p-diffusion 36A and p-diffusion 36C, it would not be possible to change photodiode configurations between photodiode configuration 30A and photodiode configuration 30C. In addition, to transition between photodiode configuration 30A and photodiode configuration 30D, a controller may measure current between n-type well 32 and p-type diffusion 36 rather than between n-type well 32 and p-type substrate 34.

A variety of design factors as disclosed herein can affect the spectral response function of a photodiode configuration. The design factors selected for the examples provided herein should not be considered to limit the scope of this disclosure as any number of variations can be made to the specific examples described herein within the spirit of this disclosure. As previously mentioned, a photodiode with a n-type well in a p-type substrate may include or not include a p-type diffusion. In addition, the dimensions of the n-type well, the p-type substrate and/or the p-type diffusion may be varied among photodiodes within an optical detector system to produce different spectral response functions. As another example, an optical detector system may include shielded and unshielded photodiodes in an array. As another example, the photocurrent can be measured between an n-type well and a p-type substrate or between an n-type well and a p-type diffusion. As another example, the diffusion (if any) and/or well can either be floating or shorted. As another example, a photodiode may include an n-type substrate with a p-type well with or without a n-type diffusion. The design factors described herein as well as additional design factors not mentioned may be used to provide multiple photodiode configurations in accordance with the spirit of this disclosure.

The techniques described in this disclosure may be implemented, at least in part, in hardware, software, firmware, or any combination thereof. For example, various aspects of the described techniques, including the disclosed compensated spectral response modules, may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "control system," "controller" or "control module" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in a computer-readable medium, such as a transitory or non-transitory computer-readable storage medium, containing instructions. Instructions embedded or encoded in a computer-readable medium, including a computer-readable storage medium, may cause one or more programmable processors, or other processors, such one or more processors included in a control system, to implement one or more of the techniques described herein, such as when instructions included or encoded in the computer-readable medium are executed by the one or more processors. Non-transitory computer-readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer-readable media. In some examples, an article of manufacture may comprise one or more computer-readable storage media.

Various examples and techniques have been described. Aspects or features of examples described herein may be combined with any other aspect or feature described in another example. These described examples and other examples are within the scope of the following claims.

What is claimed is:

1. A method comprising:
   receiving an indication of a first photocurrent from one or more photodiodes configured to generate the first photocurrent in response to an incident light according to a first spectral response function, wherein the one or more photodiodes configured to generate the first photocurrent include p-type substrates and n-type wells within the p-type substrates, and wherein the one or more photodiodes configured to generate the first photocurrent are unshielded from the incident light;
   receiving an indication of a second photocurrent from one or more photodiodes configured to generate the second photocurrent in response to the incident light according to a second spectral response function, wherein the second spectral response function is different from the first spectral response function, wherein the one or more photodiodes configured to generate the second photocurrent include p-type substrates, n-type wells within the p-type substrates, and p-type diffusions within the n-type wells and shorted to the n-type wells, and wherein the one or more photodiodes configured to generate the second photocurrent are unshielded from the incident light;
   receiving an indication of a third photocurrent from one or more photodiodes configured to generate the third photocurrent in response to the incident light according to a third spectral response function, wherein the third spectral response function is different from the first spectral response function and from the second spectral response function, wherein the one or more photodiodes configured to generate the third photocurrent include p-type substrates and n-type wells within the p-type substrates, and wherein the one or more photodiodes configured to generate the third photocurrent are shielded from the incident light;
   outputting an indication of the intensity of the incident light according to fourth spectral response function, wherein the indication of the intensity of the incident light is based on each of the first photocurrent, the second photocurrent, and the third photocurrent, wherein the fourth spectral response function is different from the first spectral response function, from the second spectral response function, and from the third spectral response function; and shorting p-type diffusions within n-type wells to the n-type wells of one or more photodiodes configured to generate the first photocurrent to reconfigure one or more photodiodes configured to generate the first photocurrent according to the first spectral response function as one or more photodiodes configured to generate the second photocurrent according to the second spectral response function.

2. The method of claim 1, wherein the fourth spectral response function approximates a photopic response.

3. The method of claim 1, wherein the one or more photodiodes configured to generate the first photocurrent further include floating p-type diffusions within the n-type wells.

4. The method of claim 1,
wherein the one or more photodiodes configured to generate the first photocurrent are mutually exclusive with the one or more photodiodes configured to generate the second photocurrent,
wherein the one or more photodiodes configured to generate the first photocurrent are mutually exclusive with the one or more photodiodes configured to generate the third photocurrent, and
wherein the one or more photodiodes configured to generate the second photocurrent are mutually exclusive with the one or more photodiodes configured to generate the third photocurrent.

5. The method of claim 1, further comprising receiving an indication of a fourth photocurrent from one or more photodiodes configured to generate the fourth photocurrent in response to the incident light according to a fifth spectral response function, wherein the indication of the intensity of the incident light is further based the fourth photocurrent.

6. The method of claim 5,
wherein the one or more photodiodes configured to generate the first photocurrent include the p-type substrates, the n-type wells within the p-type substrates and floating p-type diffusions within the n-type wells, wherein the one or more photodiodes configured to generate the second photocurrent include the p-type substrates, the n-type wells within the p-type substrates and the p-type diffusions within the n-type wells and shorted to the n-type wells, wherein the one or more photodiodes configured to generate the third photocurrent include the p-type substrates, the n-type wells within the p-type substrates and p-type diffusions within the n-type wells and shorted to the n-type wells, the p-type diffusions within the n-type wells of the one or more photodiodes configured to generate the third photocurrent being thinner than the n-type wells of the one or more photodiodes configured to generate the second photocurrent, and wherein the one or more photodiodes configured to generate the fourth photocurrent include p-type substrates, n-type wells within the p-type substrates and floating p-type diffusions within the n-type wells, the one or more photodiodes configured to generate the third photocurrent are shielded from the incident light.

7. The method of claim 1,
wherein the one or more photodiodes configured to generate the first photocurrent include the p-type substrates, the n-type wells within the p-type substrates and floating p-type diffusions within the n-type wells, wherein the one or more photodiodes configured to generate the second photocurrent include the p-type substrates, the n-type wells within the p-type substrates and the p-type diffusions within the n-type wells and shorted to the n-type wells, wherein the one or more photodiodes configured to generate the third photocurrent include the p-type substrates, the n-type wells within the p-type substrates and floating p-type diffusions within the n-type wells, wherein the p-type diffusions of the one or more photodiodes configured to generate the third photocurrent are thinner than the p-type diffusions of the one or more photodiodes configured to generate the second photocurrent.

8. The method of claim 1, wherein subtracting the second spectral response function from the first spectral response function provides a fifth spectral response function with a peak response between 500 nm and 600 nm.

9. The method of claim 8, wherein the second spectral response function is proportionally more sensitive in the near infra-red (NIR) spectrum as compared the first spectral response function.

10. The method of claim 9, wherein the third spectral response function is proportionally less sensitive to wavelengths less than 600 nm than the first spectral response function such that subtracting third spectral response function from first provides a sixth spectral response function spectral response function that provides an indication of the proportion of wavelengths less than 600 nm within the incident light.

11. The method of claim 1, further comprising outputting an indication of the spectral content of the incident light based on two or more of the first photocurrent, the second photocurrent, and the third photocurrent.

12. An optical detector comprising:
a first set of one or more photodiodes configured to generate a first photocurrent according to a first spectral response function of an incident light, wherein the first set of the one or more photodiodes configured to generate the first photocurrent include p-type substrates and n-type wells within the p-type substrates, and wherein the first set of the one or more photodiodes configured to generate the first photocurrent are unshielded from the incident light;
a second set of one or more photodiodes configured to generate a second photocurrent according to a second spectral response function of the incident light, wherein the second spectral response function is different from the first spectral response function, wherein the second set of the one or more photodiodes configured to generate the second photocurrent include p-type substrates, n-type wells within the p-type substrates, and p-type diffusions within the n-type wells and shorted to the n-type wells, and wherein the second set of the one or more photodiodes configured to generate the second photocurrent are unshielded from the incident light;
a third set of one or more photodiodes configured to generate a third photocurrent according to a third spectral response function of the incident light, wherein the third spectral response function is different from the first spectral response function and from the second spectral response function, wherein the third set of the one or more photodiodes configured to generate the third photocurrent include p-type substrates and n-type wells within the p-type substrates, and wherein the third set of one or more photodiodes configured to generate the third photocurrent are shielded from the incident light; and
a module configured to output an indication of the intensity of the incident light according to a fourth spectral response function based on each of the first photocurrent, the second photocurrent, and the third photocurrent, wherein the fourth spectral response function is different from the first spectral response function, from the second spectral response function, and from the third spectral response function;

wherein p-type diffusions within n-type wells are shorted to the n-type wells of the first set of one or more photodiodes configured to generate the first photocurrent to reconfigure the first set of one or more photodiodes configured to generate the first photocurrent according to the first spectral response function as the second set of one or more photodiodes configured to generate the second photocurrent according to the second spectral response function.

13. The optical detector of claim 12, wherein the fourth spectral response function approximates a photopic response.

14. The optical detector of claim 12,
wherein the one or more photodiodes configured to generate the first photocurrent are mutually exclusive with the one or more photodiodes configured to generate the second photocurrent,
wherein the one or more photodiodes configured to generate the first photocurrent are mutually exclusive with the one or more photodiodes configured to generate the third photocurrent, and
wherein the one or more photodiodes configured to generate the second photocurrent are mutually exclusive with the one or more photodiodes configured to generate the third photocurrent.

15. The optical detector of claim 12,
further comprising a fourth set of one or more photodiodes configured to generate a fourth photocurrent according to a fifth spectral response function,
wherein the indication of the intensity of the incident light is further based the fourth photocurrent.

16. The optical detector of claim 15,
wherein the one or more photodiodes configured to generate the first photocurrent include the p-type substrates, the n-type wells within the p-type substrates and floating p-type diffusions within the n-type wells, wherein the one or more photodiodes configured to generate the second photocurrent include the p-type substrates, the n-type wells within the p-type substrates and the p-type diffusions within the n-type wells and shorted to the n-type wells, wherein the one or more photodiodes configured to generate the third photocurrent include the p-type substrates, the n-type wells within the p-type substrates and p-type diffusions within the n-type wells and shorted to the n-type wells, the p-type diffusions within the n-type wells of the one or more photodiodes configured to generate the third photocurrent being thinner than the n-type wells of the one or more photodiodes configured to generate the second photocurrent, and wherein the one or more photodiodes configured to generate the fourth photocurrent include p-type substrates, n-type wells within the p-type substrates and floating p-type diffusions within the n-type wells, the one or more photodiodes configured to generate the third photocurrent are shielded from the incident light.

17. The optical detector of claim 12,
wherein the one or more photodiodes configured to generate the first photocurrent include the p-type substrates, the n-type wells within the p-type substrates and floating p-type diffusions within the n-type wells, wherein the one or more photodiodes configured to generate the second photocurrent include the p-type substrates, the n-type wells within the p-type substrates and the p-type diffusions within the n-type wells and shorted to the n-type wells, wherein the one or more photodiodes configured to generate the third photocurrent include the p-type substrates, the n-type wells within the p-type substrates and floating p-type diffusions within the n-type wells, wherein the p-type diffusions of the one or more photodiodes configured to generate the third photocurrent are thinner than the p-type diffusions of the one or more photodiodes configured to generate the second photocurrent.

18. The optical detector of claim 12, wherein subtracting the second spectral response function from the first spectral response function provides a fifth spectral response function with a peak response between 500 nm and 600 nm.

19. The optical detector of claim 12, wherein the photodiodes configured to generate the first, second and third photocurrent where each manufactured using complementary metal-oxide-semiconductor (CMOS) processes.

20. The optical detector of claim 12, wherein the module is further configured to output an indication of the spectral content of the incident light based on two or more of the first photocurrent, the second photocurrent, and the third photocurrent.

21. A system comprising:
a first set of one or more photodiodes configured to generate a first photocurrent according to a first spectral response function of an incident light, wherein the first set of the one or more photodiodes configured to generate the first photocurrent include p-type substrates and n-type wells within the p-type substrates, and wherein the first set of the one or more photodiodes configured to generate the first photocurrent are unshielded from the incident light;
a second set of one or more photodiodes configured to generate a second photocurrent according to a second spectral response function of the incident light, wherein the second spectral response function is different from the first spectral response function, wherein the second set of the one or more photodiodes configured to generate the second photocurrent include p-type substrates, n-type wells within the p-type substrates, and p-type diffusions within the n-type wells and shorted to the n-type wells, and wherein the second set of the one or more photodiodes configured to generate the second photocurrent are unshielded from the incident light;
a third set of one or more photodiodes configured to generate a third photocurrent according to a third spectral response function of the incident light, wherein the third spectral response function is different from the first spectral response function and from the second spectral response function, wherein the third set of the one or more photodiodes configured to generate the third photocurrent include p-type substrates and n-type wells within the p-type substrates, and wherein the third set of one or more photodiodes configured to generate the third photocurrent are shielded from the incident light; and
means for outputting an indication of the intensity of the incident light according to a fourth spectral response function based on each of the first photocurrent, the second photocurrent, and the third photocurrent, wherein the fourth spectral response function is different from the first spectral response function, from the second spectral response function, and from the third spectral response function;
wherein p-type diffusions within n-type wells are shorted to the n-type wells of the first set of one or more photodiodes configured to generate the first photocurrent to reconfigure the first set of one or more photodiodes configured to generate the first photocurrent according to the first spectral response function as the second set of one or more photodiodes configured to generate the second photocurrent according to the second spectral response function.

\* \* \* \* \*